(12) United States Patent
Kim

(10) Patent No.: US 11,508,316 B2
(45) Date of Patent: Nov. 22, 2022

(54) DISPLAY DEVICE AND METHOD FOR APPLYING AN OFFSET DATA VOLTAGE BASED ON THE SENSED CURRENT FLOW IN A TARGET WIRE

(71) Applicant: Samsung Display Co., Ltd., Yongin-Si (KR)

(72) Inventor: Kyun Ho Kim, Yongin-si (KR)

(73) Assignee: Samsung Display Co., Ltd.

( * ) Notice: Subject to any disclaimer, the term of this patent is extended or adjusted under 35 U.S.C. 154(b) by 196 days.

(21) Appl. No.: 16/846,417

(22) Filed: Apr. 13, 2020

(65) Prior Publication Data

US 2021/0005146 A1 Jan. 7, 2021

(30) Foreign Application Priority Data

Jul. 4, 2019 (KR) ........................ 10-2019-0080837

(51) Int. Cl.
*G09G 3/3291* (2016.01)
*G09G 3/3258* (2016.01)
*G09G 3/3233* (2016.01)
*H01L 27/32* (2006.01)
*G09G 3/3266* (2016.01)

(52) U.S. Cl.
CPC ......... *G09G 3/3291* (2013.01); *G09G 3/3233* (2013.01); *G09G 3/3258* (2013.01); *G09G 3/3266* (2013.01); *H01L 27/3276* (2013.01); *G09G 2320/0673* (2013.01)

(58) Field of Classification Search
None
See application file for complete search history.

(56) References Cited

U.S. PATENT DOCUMENTS

| 9,601,058 | B2 | 3/2017 | Lee et al. |
| 2008/0001974 | A1* | 1/2008 | Kim .................... G09G 3/3233 345/690 |
| 2016/0275871 | A1* | 9/2016 | Lee ...................... G09G 3/3291 |
| 2016/0307490 | A1 | 10/2016 | Lee et al. |
| 2016/0343305 | A1* | 11/2016 | Kamiyamaguchi .. G09G 3/3241 |

FOREIGN PATENT DOCUMENTS

| KR | 10-2016-0123452 A | 10/2016 |
| KR | 10-1789602 B1 | 10/2017 |
| KR | 10-1889784 B1 | 8/2018 |
| KR | 10-1960762 B1 | 7/2019 |

* cited by examiner

*Primary Examiner* — Amare Mengistu
*Assistant Examiner* — Sarvesh J Nadkarni
(74) *Attorney, Agent, or Firm* — Innovation Counsel LLP

(57) ABSTRACT

Provided are a display device and a method of operating the same. The method of operating the display device, which includes a display panel including a plurality of pixels and a data driver configured to provide data signals having different voltage levels to all data lines connected to pixels, comprises steps of applying a data signal having a first data voltage to all the data lines, determining whether a preset sensing current flows in a target wire, and applying a data signal having a second data voltage to all the data lines, wherein the second data voltage is offset from the first data voltage by a certain voltage level.

18 Claims, 7 Drawing Sheets

DISPLAY DEVICE AND METHOD FOR APPLYING AN OFFSET DATA VOLTAGE BASED ON THE SENSED CURRENT FLOW IN A TARGET WIRE

CROSS-REFERENCE TO RELATED APPLICATION

This application claims priority to and the benefit of Korean Patent Application No. 10-2019-0080837 filed in the Korean Intellectual Property Office on Jul. 4, 2019, the entire contents of which are incorporated herein by reference.

BACKGROUND

1. Field

The present disclosure relates to a display device and a method of operating the same, and more specifically, to a method of operating a display device which is not driven for a long time.

2. Description of the Related Art

Long term storage reliability evaluation has been performed to determine whether a display device is normally operable when the display device is driven again after the display device, which was driven, has been unused for a long time.

Recently, two long term storage reliability evaluations have been used. The first method has been used in which, in a state in which a screen of a display device is turned off, a field effect transistor is turned on, a voltage of a light-emitting element is fed back, and a distribution of the voltage is analyzed to adjust a voltage level of a data signal and adjust luminance.

In addition, the second method has been used in which luminance of a display device is photographed and then a voltage level of a data signal is controlled to adjust luminance for each position.

SUMMARY

An example embodiment of the present disclosure provides a method of operating a display device in a case in which the display device is not operable when the display device is driven again after the display device, which was driven, has been unused for a long time.

Another purpose of the present disclosure is to provide a display device in which a function of normally operating the display device is performed.

It should be understood, however, that the object of the present disclosure may be not to be limited by the foregoing object, but may be variously expanded without departing from the spirit and scope of the present disclosure.

A method of operating a display device which includes a display panel including a plurality of pixels and a data driver configured to provide data signals having different voltage levels to all data lines connected to pixels according to an example embodiment of the present disclosure includes applying a data signal having a first data voltage to all the data lines; determining whether a preset sensing current flows in at least some wires; and applying a data signal having a second data voltage to all the data lines, wherein the second data voltage is offset from the first data voltage by a certain voltage level.

The display device may further include a current detection unit configured to sense a global current supplied to or emitted from the display panel, the at least some wires may be wires for connecting the current detection unit and the display panel, and the sensing current may be the global current.

When the data signal having the first data voltage is applied, the global current may not flow, and when the data signal having the second data voltage is applied, the global current may flow.

The method may further include, prior to the applying of the data signal having the second data voltage to all the data lines, determining an offset sign.

The determining of the offset sign of the second data voltage may include applying a data signal oscillated in a form in which a level higher than that of the first data voltage and a level lower than that of the first data voltage is alternately repeated.

The data signal oscillated in the form may diverge.

The method may further include, prior to the applying of the data signal having the second data voltage to all the data lines, determining a voltage level of the offset.

The second data voltage may have a voltage level emitted by a light-emitting element provided in each of the pixels.

The method may further include, after the applying of the data signal having the second data voltage to all the data lines, adjusting the second data voltage.

Each of the pixels may include a driving transistor which includes a gate terminal connected to each of the data lines, a first terminal, and a second terminal; and a light-emitting element connected to the second terminal of the driving transistor, wherein the first data voltage has a level higher than that of a threshold voltage preset in the driving transistor.

The display device may further include a gamma control unit configured to apply a gamma control signal to the data driver, and the gamma controller may determine a voltage level of the second data voltage.

The at least some wires may include a wire in which a driving current flowing in each of the pixels in the display panel flows.

The first data voltage may range from 2 V to 7 V, and the second data voltage may range from 7 V to 12 V.

The preset sensing current may range from 20 A to 30 A.

A display according to another example embodiment of the present disclosure includes a display panel including a plurality of pixels, a data driver configured to supply data signals having different voltage levels to data lines connected to the pixels, a scan driver configured to supply scan signals through one or more scan lines connected to the pixels, a voltage controller configured to supply a current detection control signal to the display panel and generate a voltage control signal, and a current detection unit configured to detect a current supplied to the display panel, wherein, when a light-emitting element provided in each of the pixels does not emit light even when the data driver supplies the data signal having a first data voltage to each of the pixels, the data driver supplies the data signal having a second data voltage which is offset from the first data voltage by a certain voltage level.

The current detection unit may sense a global current supplied to the display panel in response to the current detection control signal.

The scan driver may include a first scan line and a second scan line which are connected to gate terminals of different transistors provided in each of the pixels, a scan signal may be transmitted through the first scan line, and a sensing signal may be transmitted through the second scan line.

The first data voltage may have a preset full-white voltage level.

Other detailed matters of the exemplary embodiments are included in the detailed description and the drawings.

DETAILED DESCRIPTION OF THE EMBODIMENTS

Advantages and features of the present disclosure and methods for accomplishing the same will be more clearly understood from example embodiments described below with reference to the accompanying drawings.

It should be understood that, although terms such as "first," "second," and the like may be used herein to describe various components, these components are not limited by these terms. These terms are only used to distinguish one element or component from another element or component. Therefore, a first component could be termed a second component without departing from the scope and spirit of the present disclosure. A single form of expression is meant to include multiple elements unless otherwise stated.

Hereinafter, the example embodiments of the present disclosure will be described in detail with reference to the accompanying drawings. Like numerals refer to like elements throughout.

Figure 1:
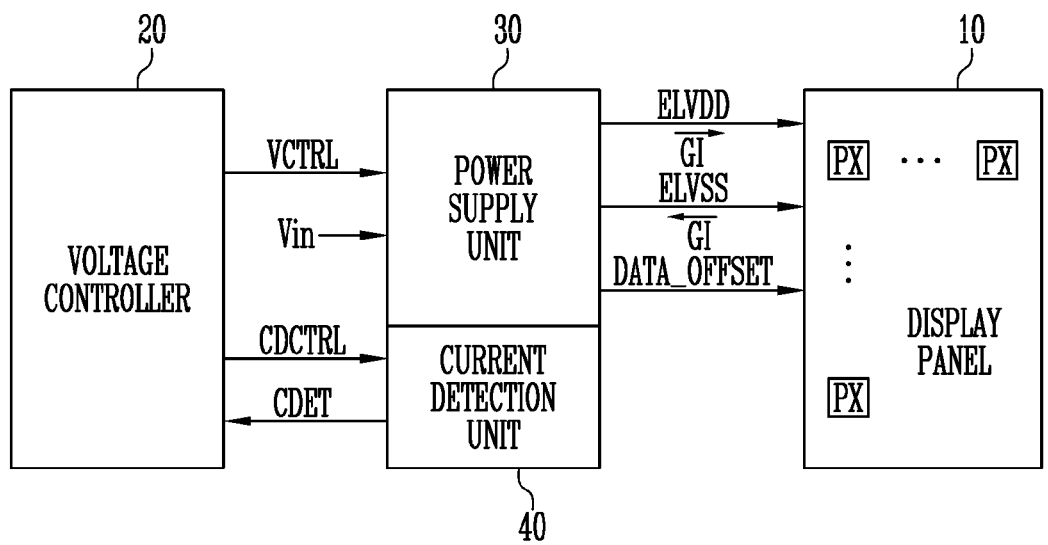
FIG. 1 is a schematic block diagram illustrating a display device according to an example embodiment of the present disclosure.
Figure 2:
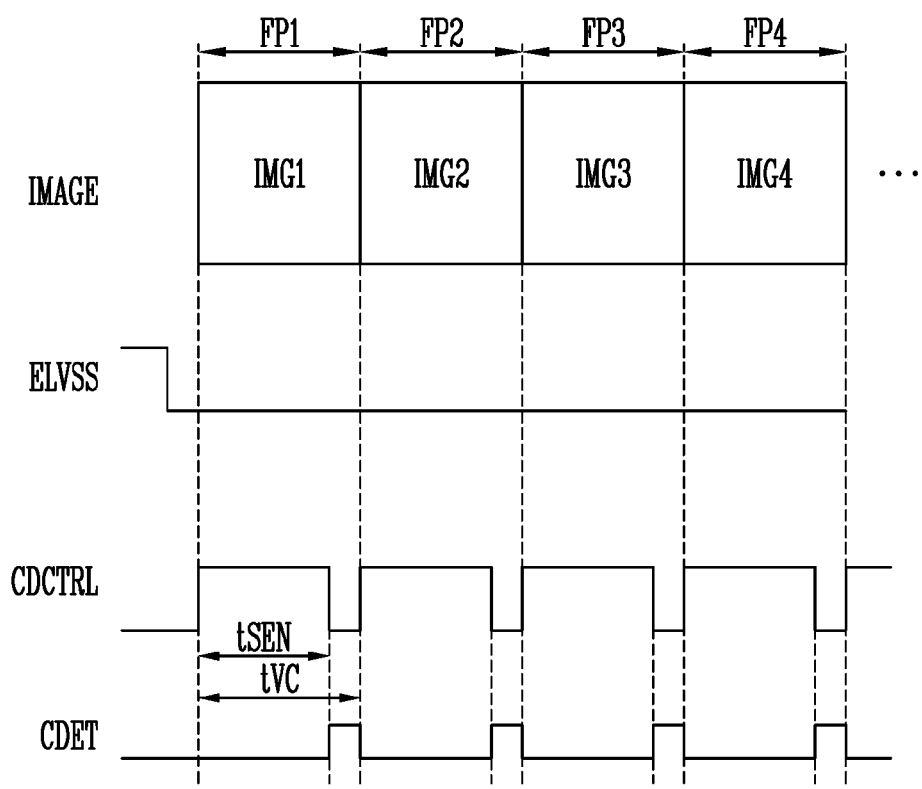
FIG. 2 is a timing diagram illustrating an example of operation of the display device of FIG. 1.

FIG. 1 is a schematic block diagram illustrating a display device according to an example embodiment of the present disclosure. FIG. 2 is a timing diagram illustrating an example of operation of the display device of FIG. 1.

In an example embodiment, a display device 1 may be a quantum dot organic light-emitting diode (OLED) display device. However, the present disclosure is not limited thereto, and the display device 1 may be an OLED display device, a liquid crystal display device, a micro light-emitting diode (LED) display device, a plasma display device, an electrophoretic display device, a micro electromechanical system (MEMS) display device, or an electrowetting display device.

Referring to FIGS. 1 and 2, the display device 1 may include a voltage controller 20, a power supply unit 30, a current detection unit 40, and a display panel 10. Only components necessary for describing the present disclosure are in FIG. 1, and components irrelevant to the description of the present disclosure are omitted. The current detection unit 40 may be included inside the power supply unit 30 or may also be implemented outside the power supply unit 30. The display panel 10 includes a plurality of pixels PX that are operated based on a high power voltage ELVDD and a low power voltage ELVSS. The display panel and the pixels PX is described below with reference to FIG. 4.

The power supply unit 30 generates the high power voltage ELVDD and the low power voltage ELVSS based on an input voltage Vin and a voltage control signal VCTRL. The power supply unit 30 may include a boost converter that generates the high power voltage ELVDD, an inverting buck-boost converter that generates the low power voltage ELVSS, and the like. The input voltage Vin provided to the power supply unit 30 may be an alternating current (AC) voltage or a direct current (DC) voltage such as a battery voltage, and the voltage converters may be an AC-DC converter or a DC-DC converter.

When a threshold voltage of a driving transistor in the pixel PX is changed, the power supply unit 30 may apply an offset data voltage DATA_OFFSET to the pixel PX in order to achieve gradation output.

The current detection unit 40 senses a global current GI supplied to the display panel 10 in response to a current detection control signal CDCTRL indicating a voltage control period tVC (see FIG. 2) and generates a current detection signal CDET indicating an average value of the global current GI for every voltage control period tVC.

The voltage controller 20 generates the current detection control signal CDCTRL such that the voltage control period tVC is changed according to whether an image is displayed on the display panel and supplies the current detection control signal CDCTRL to the current detection unit 40. In addition, the voltage controller 20 may generate the voltage control signal VCTRL based on the current detection signal CDET supplied from the current detection unit 40 and may supply the voltage control signal VCTRL to the power supply unit 30. The voltage controller 20 may adjust the voltage control signal VCTRL to control voltage levels of the high power voltage ELVDD and/or the low power voltage ELVSS generated by the power supply unit 30.

Although not shown, the voltage controller 20 may change the voltage control period tVC based on the operability of the voltage controller 20. The voltage control period tVC corresponds to an update period of the power voltages ELVDD and ELVSS. Thus, the voltage control period tVC corresponds to a period during which an average value of the global current GI is provided by the current detection unit 40.

For example, in the display device 1, one image may be displayed on the display panel 10 during one frame section. As illustrated in FIG. 2, a first image IMG1 may be displayed on the display panel 10 during a first frame section FP1. A second image IMG2 may be displayed during a second frame section FP2. A third image IMG3 may be displayed during a third frame section FP3. A fourth image IMG4 may be displayed during a fourth frame section FP4.

In an operation example of the display device 1, the low power voltage ELVSS may be maintained in a negative voltage level while a plurality of images IMG1 to IMG4 are displayed. The voltage control period tVC in a two-dimensional mode may correspond to one frame section, and the current detection signal CDET may indicate an average value of the global current GI for every one frame section. For convenience of description, the current detection signal CDET as illustrated in FIG. 2 includes a pulse for every voltage control period tVC. However, the current detection signal CDET may be a signal with a plurality of bits which indicates a digital value corresponding to an average value of the global current GI for every voltage control period tVC.

The voltage control period tVC may include a sensing section tSEN for sensing the global current GI, and the sensing section tSEN may correspond to a section during which the current detection control signal CDCTRL is activated to a logic high level. The current detection unit 40 of FIG. 1 may obtain an average value by integrating the global current GI during the sensing section tSEN. For example, when an image is displayed at a frame rate of 120 fps (frame per second), the voltage control period tVC, that is, one frame section may correspond to 8.33 ms, and the sensing section tSEN may be set to 8.22 ms. In addition, in some example embodiments, when an image is displayed, since the same image is continuously displayed during one frame section, the global current GI may be measured relatively accurately even when the sensing section tSEN is set as a portion of one frame section.

Figure 3:
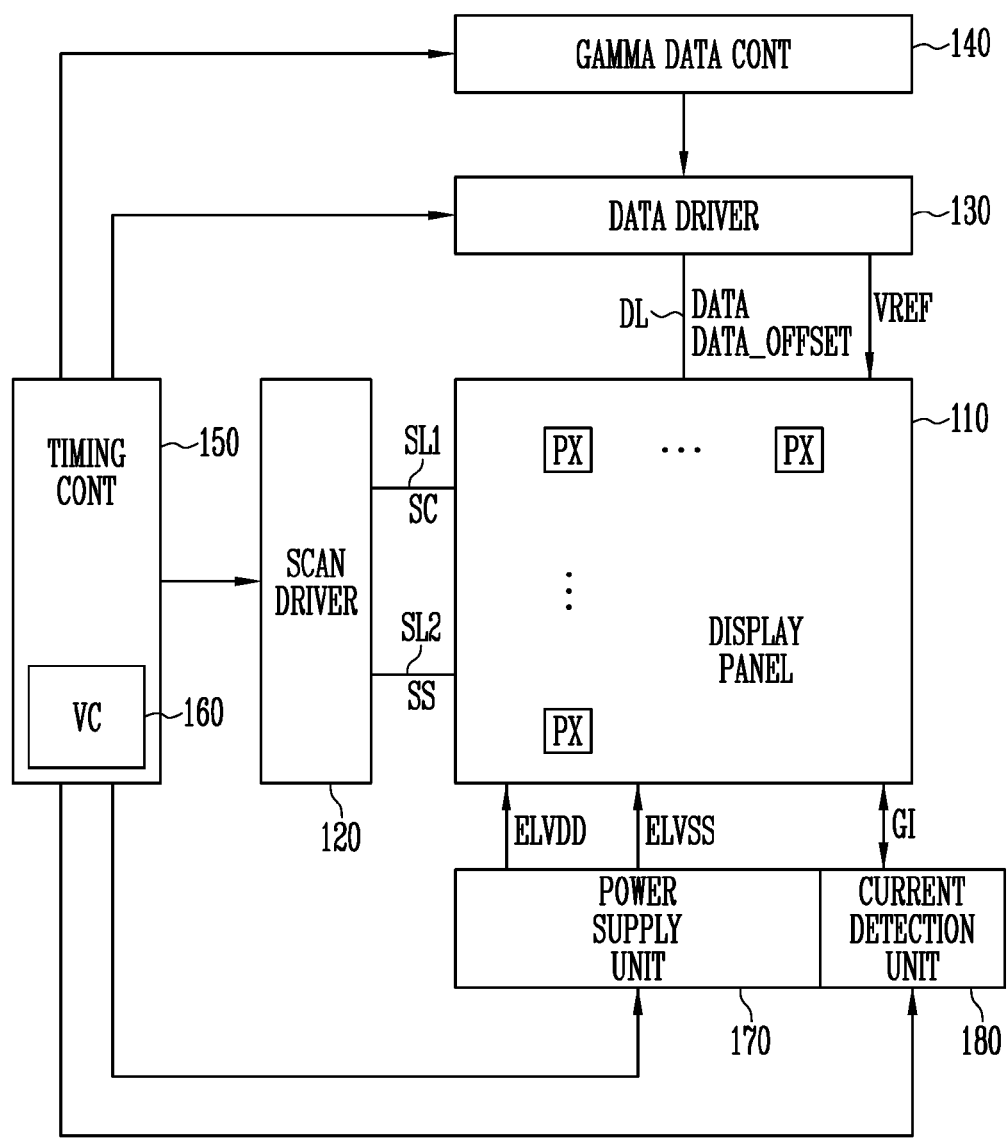
FIG. 3 is a block diagram illustrating the display device according to the example embodiment of the present disclosure.
Figure 4:
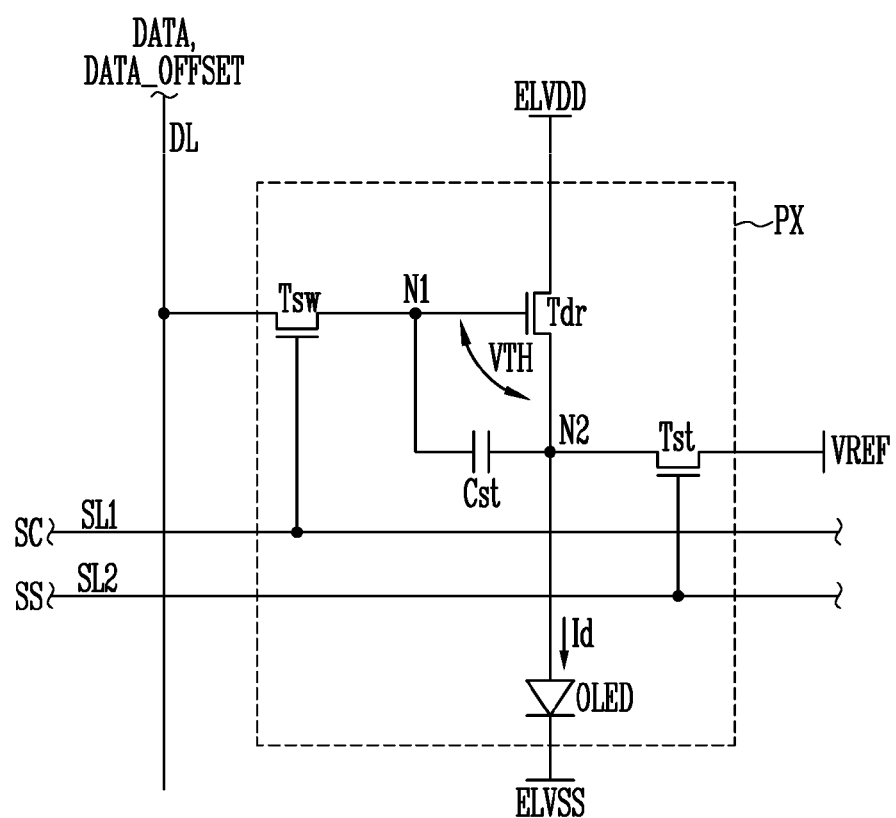
FIG. 4 is a circuit diagram illustrating one pixel of FIG. 3.

FIG. 3 is a block diagram illustrating the display device according to the example embodiment of the present disclosure in more detail. FIG. 4 is a circuit diagram illustrating one pixel of FIG. 3. Descriptions of the same components as those of FIG. 1 are omitted in the descriptions of FIGS. 3 and 4, and for the convenience of description, the reference numerals of some components that perform the same function are changed.

Referring to FIGS. 3 and 4, the display device 1 includes a display panel 110 including a plurality of pixels PX and a driver configured to drive the display panel 110. The driver includes a scan driver 120, a data driver 130, a gamma controller 140, a timing controller 150, a power supply unit 170, a current detection unit 180, and a voltage controller (VC) 160.

The display panel 110 may be connected to the data driver 130 of the driver through a plurality of data lines DL and may be connected to the scan driver 120 of the driver through a plurality of scan lines SL1 and SL2.

In an example embodiment, the display panel 110 may include the plurality of pixels PX disposed in a row direction and a column direction and disposed in a matrix form. In the present disclosure, the row direction refers to a horizontal direction in the drawing, and the column direction refers to a vertical direction in the drawing, i.e., a direction intersecting with the row direction. In an example embodiment, the row direction and the column direction may be understood as relative directions intersecting with each other.

In an example embodiment, a row of pixels PX defined by the plurality of pixels PX disposed in the row direction may be connected to the same scan line SL1 or SL2. In addition, a column of pixels PX of the plurality of pixels PX disposed in the column direction may be connected to the same data line DL.

In an example embodiment, the display panel 110 may include a light-emitting element that self-emits light without a backlight for each pixel PX. For example, the light-emitting element may be an OLED (see FIG. 4).

As illustrated in FIG. 4, in an example embodiment, each pixel PX included in the display panel 110 comprises a switching transistor Tsw, a driving transistor Tdr, a sensing transistor Tst, a storage capacitor Cst, and the OLED.

The switching transistor Tsw may include a first terminal connected to the data line DL, a second terminal connected to a first node N1, and a gate terminal connected to a first scan line SL1. Here, the first node N1 may be a node defined by the second terminal of the switching transistor Tsw, a gate terminal of the driving transistor Tdr, and a first electrode of the storage capacitor Cst.

The switching transistor Tsw may transmit a data signal DATA supplied from the data driver 130 to the storage capacitor Cst and the driving transistor Tdr in response to a scan signal SC applied from the scan driver 120.

The storage capacitor Cst may include the first electrode connected to the first node N1 and a second electrode connected to a second node N2. Here, the second node N2 may be a node defined by the second electrode of the storage capacitor Cst, a second terminal of the driving transistor Tdr, a second terminal of the sensing transistor Tst, and an anode electrode of the OLED.

The storage capacitor Cst may store the data signal DATA transmitted from the switching transistor Tsw. The storage capacitor Cst may store a voltage signal having a level greater than or equal to that of a threshold voltage VTH of the driving transistor Tdr for a certain time, which is disposed between the first electrode and the second electrode.

The driving transistor Tdr may include a first terminal to which a high power voltage ELVDD is applied, a second terminal connected to the second node N2, and a gate electrode connected to the first node N1. The driving transistor Tdr may be turned on or off according to the data signal DATA stored in the storage capacitor Cst. For example, when the data signal DATA having a level higher than that of the threshold voltage VTH of the driving transistor Tdr is applied to the gate terminal, the driving transistor Tdr may be turned on, and a driving current Id may flow from the first terminal to the second terminal of the driving transistor Tdr.

The OLED may include an anode electrode connected to the second node N2 and a cathode electrode to which a low power voltage ELVSS is applied. The OLED may emit light based on the driving current Id flowing from the high power voltage ELVDD to the low power voltage ELVSS while the driving transistor Tdr is turned on.

The sensing transistor Tst may include a first terminal to which an initialization voltage VREF is applied, a second terminal connected to the second node N2, and a gate terminal connected to a second scan line. The sensing transistor Tst may supply the initialization voltage VREF transmitted to the first terminal with the second node N2 to which the second terminal of the driving transistor Tdr is connected or may sense a voltage or a current of the second node N2 to which the second terminal of the driving transistor Tdr is connected.

An operating time of the sensing transistor Tst may be similar/equal to or different from an operating time of the switching transistor Tsw according to an external compensation algorithm (not shown). In an example, the gate terminal of the switching transistor Tsw may be connected to the first scan line SL1, and the gate terminal of the sensing transistor Tst may be connected to the second scan line SL2. In this case, the scan signal SC is transmitted to the first scan line SL1, and a sensing signal SS is transmitted to the second scan line SL2. In another example, the first scan line SL1 connected to the gate terminal of the switching transistor Tsw and the second scan line SL2 connected to the gate terminal of the sensing transistor Tst may be connected together.

The initialization voltage VREF may be provided from the data driver 130. In this case, the data driver 130 may sense the second node N2 of the pixel PX and generate a sensing result in a real time, during a non-display period of an image, or during at least one frame section. In an example embodiment, the initialization voltage VREF may be about 2 V.

Meanwhile, in some example embodiments, the switching transistor Tsw and the sensing transistor Tst may be turned on at the same time. In this case, a sensing operation through the initialization voltage VREF and a data output operation for outputting the data signal DATA are separated from each other based on a time division method of the data driver 130.

In addition, a compensation target according to the sensing result may be the data signal DATA in a digital form, the data signal DATA in an analog form, or a gamma signal supplied by the gamma controller 140. Furthermore, a compensation circuit configured to generate a compensation signal (or compensation voltage) based on the sensing result may be included in the data driver 130 or the timing controller 150, or may be implemented as a separate circuit.

Meanwhile, the structure of the pixel PX including three transistors and one capacitor according to the present example embodiment may be more suitable for manufacturing large display devices, but the present embodiments are not limited to the number of transistors and the number of capacitors, which constitute the pixel PX. For example, in an example embodiment, the pixel PX may be configured to include seven transistors and one capacitor. In this case, the structure of the pixel PX may be more suitable for manufacturing small display devices.

The data driver 130 may apply the data signal DATA and an offset data voltage DATA_OFFSET to the display panel 110 through the plurality of data lines DL. The scan driver 120 may apply one or more scan signals to the display panel 110 through the plurality of scan lines, i.e., the first scan line SL1 and the second scan line SL2. The gamma controller 140 may apply a gamma control signal to the data driver 130 through a gamma control line.

The VC 160 generates a current detection control signal CDCTRL such that a voltage control period tVC is changed according to a displayed image, and supplies the generated current detection control signal CDCTRL to the display panel 10. The VC 160 generates a voltage control signal VCTRL based on a current detection signal CDET.

The timing controller 150 may control operation of the display device 1. In an example embodiment, the VC 160 may be included in the timing controller 150. For example, the timing controller 150 may supply certain control signals to the data driver 130, the gamma controller 140, and the scan driver 120 to control the operation of the display device 1.

In an example embodiment, the data driver 130, the gamma controller 140, the scan driver 120, and the timing controller 150 may be implemented as one integrated circuit (IC). In another example embodiment, the data driver 130, the scan driver 120, and the timing controller 150 may be implemented as two or more ICs.

The power supply unit 170 may supply a first power voltage (for example, the high power voltage ELVDD) and a second power voltage (for example, the low power voltage ELVSS) to the display panel 110. In an example embodiment, the power supply unit 170 may control light emission of the display panel 110 by adjusting at least one of the high power voltage ELVDD and the low power voltage ELVSS. The power supply unit 170 may apply the high power voltage ELVDD and the low power voltage ELVSS having a first voltage difference to the plurality of pixels PX such that the plurality of pixels PX do not emit light during a non-emission time. The power supply unit 170 may apply the high power voltage ELVDD and the low power voltage ELVSS having a second voltage difference greater than the first voltage difference to rows of the plurality of pixels PX such that the plurality of pixels PX emit light during an emission time. For example, the first voltage difference may be close to 0 V, and the second voltage difference may be a sufficient voltage difference for the OLED to emit light.

As described above, the current detection unit 180 senses a global current GI supplied to the display panel 110 in response to the current detection control signal CDCTRL indicating the voltage control period tVC, and generates the current detection signal CDET indicating an average value of the global current GI for every voltage control period tVC.

On the other hand, when the display panel 110, which was operable, is driven again after being unused and left in a high or low temperature state for a long time, the threshold voltage VTH of the driving transistor Tdr of each pixel PX may be offset. In this case, the pixels PX may not be operated at a preset voltage level of the data signal DATA. Hereinafter, the offset of the threshold voltage VTH of the driving transistor Tdr and a method of compensating for the data signal DATA according to long term non-driving are described with reference to FIGS. 5 to 7.

Figure 5:
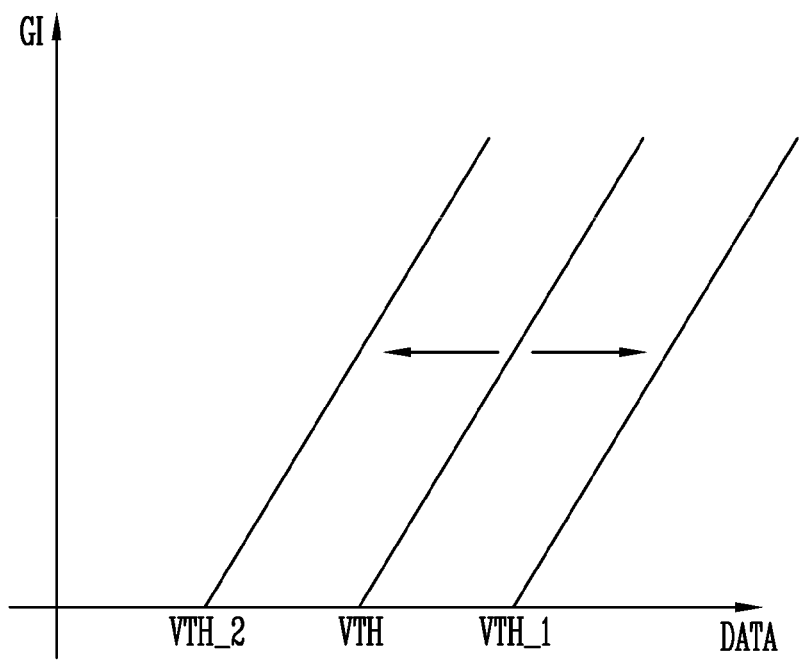
FIG. 5 is a graph showing a current level of a global current according to a voltage level of a data signal in a display device according to an example embodiment.
Figure 6:
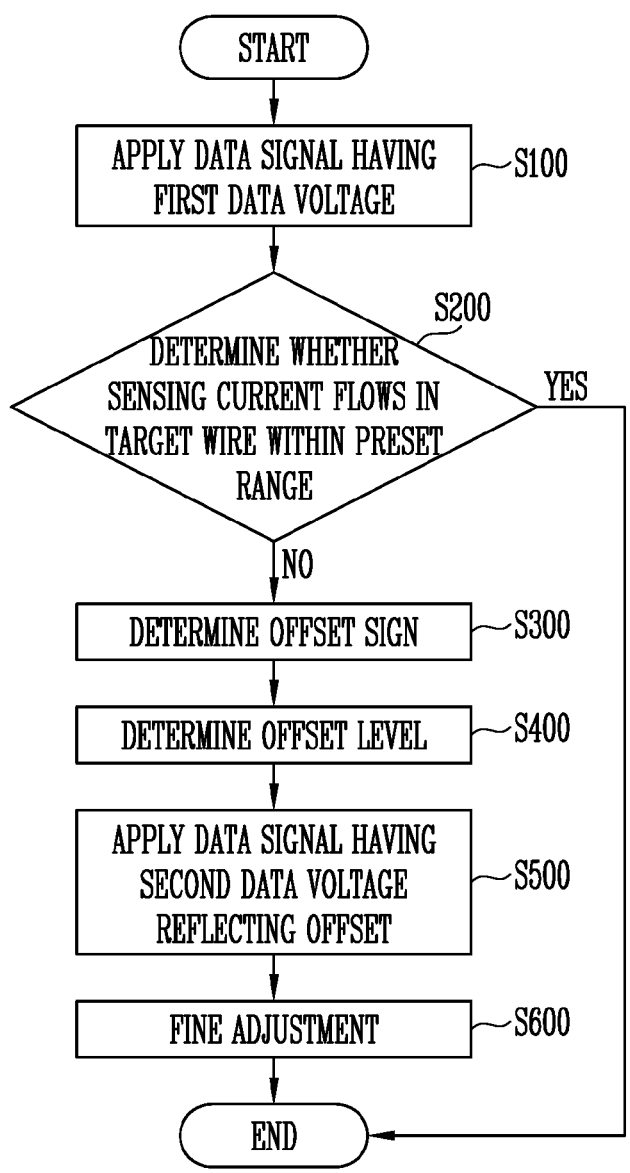
FIG. 6 is an algorithm flowchart illustrating a method of operating a display device according to an example embodiment.
Figure 7:
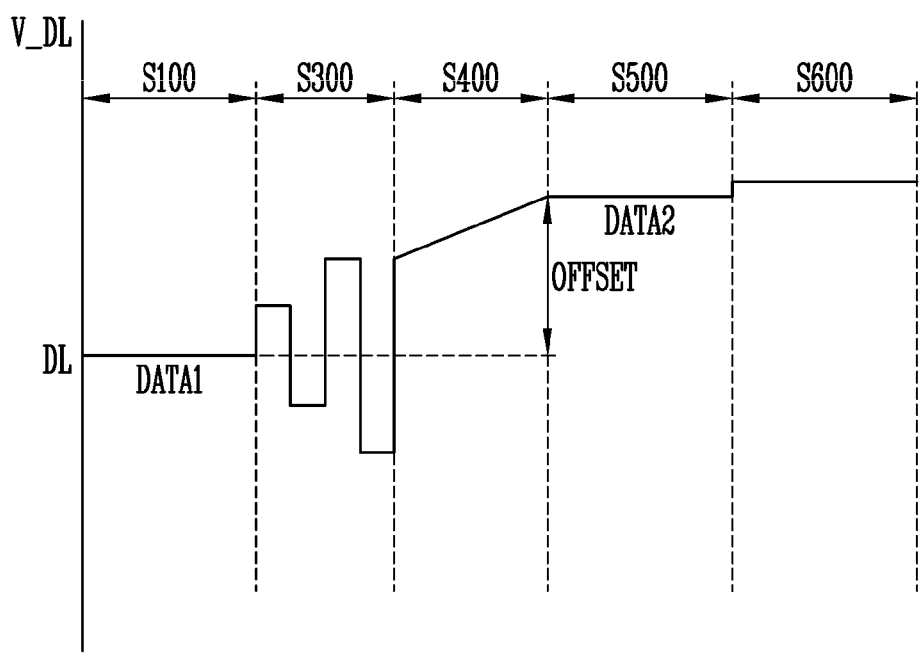
FIG. 7 is a timing diagram illustrating a voltage level of a data signal for each operation of FIG. 6.

FIG. 5 is a graph showing a current level of a global current according to a voltage level of a data signal in a display device according to an example embodiment. FIG. 6 is an algorithm flowchart illustrating a method of operating a display device according to an example embodiment. FIG. 7 is a timing diagram illustrating a voltage level of a data signal for each operation of FIG. 6. FIG. 7 illustrates a voltage level V_DL of a data signal flowing in one data line DL for each operation.

Referring to FIG. 5, the threshold voltage VTH of the driving transistor Tdr in the display device 1 may be offset. The threshold voltage VTH of the driving transistor Tdr in the display device 1 may be offset in a positive direction (i.e., VTH_1) or a negative direction (i.e., VTH_2) according to a time during which the display device 1 is left in a high temperature or low temperature state.

When the data signal DATA having a level less than that of the threshold voltage VTH is supplied to the driving transistor Tdr in each pixel PX, as described above, the driving current Id may not flow in the OLED in each pixel PX. In this case, a current level of the global current GI may be about 0 A.

When the data signal DATA having a level greater than or equal to that of the threshold voltage VTH is supplied to the driving transistor Tdr in each pixel PX, the driving current Id may flow in the OLED in each pixel PX. In this case, as a voltage level of the data signal DATA increases, a current level of the global current GI may increase. As illustrated in FIG. 5, as the data signal DATA having a level greater than that of the threshold voltage VTH increases, a current level of the global current GI compiles with a linear function. A coefficient of an independent variable of the linear function may be proportional to the number of the pixels PX in the display panel 110.

In an example embodiment, the threshold voltage VTH of the driving transistor Tdr preset in the display panel 110 may range from 2 V to 7 V. When the threshold voltage VTH is offset in the positive direction, the driving transistor Tdr of each pixel PX may have a first offset threshold voltage VTH_1. When the threshold voltage VTH is offset in the minus direction, the driving transistor Tdr of each pixel PX may have a second offset threshold voltage VTH_2. In an example embodiment, the threshold voltage VTH may be offset from 1 V to 5 V. In this case, the first offset threshold voltage VTH_1 may range from 7 V to 12 V. Similarly, the second offset threshold voltage VTH_2 may range from −3 V to 2 V.

The above-described voltage level and offset level of the preset threshold voltage VTH are only illustrative, and the voltage level and offset level of the preset threshold voltage VTH may be different for each display device. The preset threshold voltage VTH may also have a positive voltage level or may also have a negative voltage level. When the threshold voltage VTH set to have the plus voltage level is offset in the minus direction, the second offset threshold voltage VTH_2 may also have a minus voltage level.

Referring to FIG. 6, a method of operating a display device 1 may include applying a data signal having a first data voltage DATA1 to a data line DL (S100), determining whether a sensing current flows in a target wire within a preset range (S200), determining an offset sign (S300), determining an offset level (S400), applying a data signal having a second data voltage DATA2 reflecting an offset to the data line DL (S500), and performing fine adjustment (S600).

In the present disclosure, respective operations are described as being sequentially performed according to the flowchart, but unless the spirit of the present disclosure is changed, it may be obvious that some operations illustrated as being continuously performed may be performed concurrently, the order of respective operations may be changed, some operations may be omitted, or another operation may be further included between respective operations.

Firstly, the step of applying of the data signal having the first data voltage DATA1 to each data line DL (S100) is described.

In an example embodiment, a data driver 130 may apply the first data voltage DATA1 to each data line DL connected to each pixel PX in a display panel 110. In an example embodiment, the first data voltage DATA1 may be within a range of the above-described threshold voltage VTH of the driving transistor Tdr or has a preset voltage level for driving a full-white image. For example, the preset voltage level for driving the full-white image may be about 8 V. In an example embodiment, the first data voltage DATA1 may be applied to all data lines DL connected to each pixel PX.

Next, the step of determining of whether the sensing current flows in the target wire within the preset range (S200) is described When the display device 1 has been left in a high or low temperature state for a long time without being driven, the threshold voltage VTH of the driving transistor Tdr may be offset to have a voltage level greater than or equal to the preset voltage level for driving the full-white image.

For example, when a data signal having the first data voltage DATA1 is applied to the data line DL, and a sensing current flows in the target wire within the preset range, the data signal having the second data voltage DATA2 reflecting the offset needs not to be applied to the data line DL.

In an example embodiment, the target wire is a wire in which the above-described global current GI flows, and may be a wire for connecting a current detection unit 180 and the display panel 110. In this case, the sensing current may be the above-described global current GI. For example, when a full-white image is displayed, a preset sensing current may range from about 20 A to about 30 A.

However, the target wire is not limited. Any wire, in which a driving current Id of each pixel PX flows, may serve a function of the target wire.

When the data signal having the first data voltage DATA1 is applied to the data line DL, and the sensing current does not flow in the target wire within the preset range, i.e., the display panel 10 is not operated, the data signal having the second data voltage DATA2 reflecting the offset from the first data voltage DATA1 needs to be applied to the data line DL. Hereinafter, operations of determining the second data voltage DATA2 is described.

The step of determining of the offset sign (S300) and the step of determining of the offset level (S400) are described.

In an example, in order to determine the offset sign, a data signal oscillated in a form in which a level higher than that of the first data voltage and a level lower than that of the first data voltage is alternately repeated may be applied to each pixel PX. For example, the oscillation may be in a diverging form. While the data signal oscillated in the form is applied, it is possible to confirm whether the sensing current rises in the target wire. For example, when the sensing current rises at a level higher than that of the first data voltage DATA1, the offset sign may be positive, and when the sensing current rises at a level lower than that of the first data voltage DATA1, the offset sign may be negative.

In an example embodiment, in order to determine the offset level, the offset level may increase until the preset sensing current flows to allow the display panel 110 to display a full-white image. A minimum offset level may be set to exceed the threshold voltage VTH (for example, the first offset threshold voltage VTH_1) of the driving transistor Tdr, which is offset due to non-driving of the display device.

Next, the step of applying of the data signal having the second data voltage DATA2 reflecting the offset to the data line DL (S500) and the step of performing of the fine adjustment (S600) are described.

In an example embodiment, when the offset sign and the offset level are determined, the data signal having the second data voltage DATA2 reflecting the offset from the first data voltage DATA1 may be applied to the data line DL. The second data voltage DATA2 may have a voltage level at which an OLED of each pixel PX emits light. In an example embodiment, the second data voltages DATA2 may be applied to all data lines DL connected to the pixels PX. In addition, the second data voltages DATA2 applied to all the data lines DL may be offset from the first data voltages DATA1 by the same offset level.

In an example embodiment, the second data voltage DATA2 may be determined by a gamma controller 140. The second data voltage DATA2 may be generated by supplying a gamma data signal based on a gamma lookup table (LUT) to the data driver 130 from the gamma controller 140.

When the display panel 110 is not operated even when the data signal having the second data voltage DATA2 is applied to the data line DL, the whole process may be performed again which correspond to the step S200 of determining whether the sensing current flows in the target wire within the preset range, the step S300 of determining the offset sign, the step S400 of determining the offset level, and the step S500 of applying the data signal having the second data signal DATA2 reflecting the offset to the data line DL (S500).

Since the threshold voltage VTH of the driving transistor Tdr may be slightly different for each pixel PX, the second data voltage DATA2 may be finely adjusted and applied to each pixel PX.

In this manner, it is possible to operate the display device 1 which has been left in a high temperature or low temperature state for a long time without being operated.

According to example embodiments of the present disclosure, a display device can be operable even when the display device is driven after being left for a long time without being driven.

However, effects of the present disclosure are not restricted to the example embodiments set forth herein and more diverse effects are included in this description.

Although the example embodiments of the present disclosure have been described with reference to the accompanying drawings, it will be understood by those skilled in the art to which the present pertains that the present disclosure can be carried out in other detailed forms without changing the technical spirits and essential features thereof. Therefore, it should be understood that the example embodiments described herein are illustrative not restrictive in all aspects. Specific details of other example embodiments are included in the detailed description and drawings.

What is claimed is:

1. A method of operating a display device which includes a display panel comprising a plurality of pixels and a data driver configured to provide data signals having different voltage levels to all data lines connected to pixels, the method comprising steps of:
    applying a data signal having a first data voltage to each data line;
    determining whether a preset sensing current flows in a target wire; and
    applying a data signal having a second data voltage to each data line when the data signal having the first data voltage is applied to each data line, and the sensing current does not flow in the target wire within a preset range, wherein the second data voltage is offset from the first data voltage by a certain voltage level,
    wherein the first data voltage includes a preset full-white voltage level adapted to drive a full-white image.

2. The method of claim 1, wherein the display device further includes a current detector disposed between a timing controller and the display panel and configured to sense a global current supplied to or emitted from the display panel,
    the target wire is a wire for connecting the current detector and the display panel, and
    the sensing current is the global current.

3. The method of claim 2, wherein, when the data signal having the first data voltage is applied, the global current does not flow, and
    when the data signal having the second data voltage is applied, the global current flows.

4. The method of claim 1, further comprising a step of, after the determining whether the preset sensing current flows in the target wire, determining an offset sign.

5. The method of claim 4, wherein the determining the offset sign includes applying a data signal oscillated in a form in which a level higher than the level of the first data voltage and a level lower than the level of the first data voltage is alternately repeated.

6. The method of claim 5, wherein the data signal oscillated in the form diverges.

7. The method of claim 4, further comprising a step of, after the determining the offset sign, determining a voltage level of the offset.

8. The method of claim 7, wherein the second data voltage includes a voltage level emitted by a light-emitting element provided in each of the pixels.

9. The method of claim 8, wherein the offset level increases until the preset sensing current flows configured to allow the display panel to display the full-white image.

10. The method of claim 1, further comprising a step of, after the applying of the data signal having the second data voltage to each data line, adjusting the second data voltage.

11. The method of claim 1, wherein each of the pixels includes:
    a driving transistor which includes a gate terminal connected to each of the data lines, a first terminal, and a second terminal; and
    a light-emitting element connected to the second terminal of the driving transistor.

12. The method of claim 1, wherein the display device further includes a gamma controller disposed between a timing controller and the data driver and configured to apply a gamma control signal to the data driver through a gamma control line, and
    the gamma controller determines a voltage level of the second data voltage.

13. The method of claim 1, wherein the target wire include a wire in which a driving current flowing in each of the pixels in the display panel flows.

14. The method of claim 1, wherein the first data voltage ranges from 2 V to 7 V, and the second data voltage ranges from 7 V to 12 V.

15. The method of claim 1, wherein the preset sensing current ranges from 20 A to 30 A.

16. A display device comprising:
    a display panel including a plurality of pixels;
    a data driver configured to supply data signals having different voltage levels to data lines connected to the display panel;
    a scan driver configured to supply scan signals through one or more scan lines connected to the display panel;
    a voltage controller configured to supply a current detection control signal to the display panel and generate a voltage control signal based on a current detection signal; and
    a current detector disposed between a timing controller and the display panel and configured to detect a current supplied to the display panel,
    wherein, when a light-emitting element provided in each of the pixels does not emit light even when the data driver supplies the data signal having a first data voltage to each of the pixels, the data driver supplies the data signal having a second data voltage which is offset from the first data voltage by a certain voltage level to each data line, and
    wherein the first data voltage includes a preset full-white voltage level adapted to drive a full-white image.

17. The display device of claim 16, wherein the current detector senses a global current supplied to the display panel in response to the current detection control signal and generates the current detection signal.

18. The display device of claim 16, wherein the scan driver includes a first scan line and a second scan line which are connected to gate terminals of different transistors provided in each of the pixels,
    a scan signal is transmitted through the first scan line, and
    a sensing signal is transmitted through the second scan line.

* * * * *